(12) United States Patent
Agoston et al.

(10) Patent No.: US 7,216,046 B2
(45) Date of Patent: May 8, 2007

(54) METHOD OF GENERATING A VARIABLE PERSISTENCE WAVEFORM DATABASE

(75) Inventors: Maria Agoston, Beaverton, OR (US); William Bruce Harrington, Beaverton, OR (US); Scott L. Halsted, Tigard, OR (US)

(73) Assignee: Tektronix, Inc., Beaverton, OR (US)

( * ) Notice: Subject to any disclaimer, the term of this patent is extended or adjusted under 35 U.S.C. 154(b) by 337 days.

(21) Appl. No.: 10/392,602

(22) Filed: Mar. 19, 2003

(65) Prior Publication Data
US 2004/0186673 A1 Sep. 23, 2004

(51) Int. Cl.
*G01R 13/00* (2006.01)

(52) U.S. Cl. .................... 702/70; 702/66; 702/176; 702/177

(58) Field of Classification Search ............... 702/66, 702/176, 177, 70; 324/72, 76.23
See application file for complete search history.

(56) References Cited

U.S. PATENT DOCUMENTS 5,343,405 A 8/1994 Kucera et al.
6,151,010 A 11/2000 Miller et al.
6,333,732 B1 12/2001 Gerlach et al.
6,384,657 B1 5/2002 Dobos
6,452,373 B2 * 9/2002 Medelius et al. ............. 324/72

OTHER PUBLICATIONS

Steven S. Skiena, "Data Structures and Programming Lecture 3", 1997, pp. 3-4.*

* cited by examiner

*Primary Examiner*—John Barlow
*Assistant Examiner*—Stephen J. Cherry
(74) *Attorney, Agent, or Firm*—William K. Bucher

(57) ABSTRACT

A variable persistence waveform database is generated by defining a First-In-First-Out (FIFO) time-ordered queue buffer for maintaining a selected number of waveform records. Digital data samples of a measurement signal are acquired and stored in a plurality of waveform records in the FIFO time-ordered queue buffer. Counts of the digital data samples for the plurality of waveform records are accumulated in a waveform database. Upon filling FIFO time-ordered queue buffer with waveform records, the digital data samples of the oldest acquired waveform record are subtracted from the accumulated counts of the waveform database and deleted from the FIFO time-ordered queue buffer and the digital data samples of the newest acquired waveform record are stored in the FIFO time-ordered queue buffer and added to the accumulated counts in the waveform database.

10 Claims, 4 Drawing Sheets

METHOD OF GENERATING A VARIABLE PERSISTENCE WAVEFORM DATABASE

BACKGROUND OF THE INVENTION

The present invention relates generally to waveform databases and more specifically to generating a variable persistence waveform database for displaying repetitive signals on a display of a measurement test instrument.

Waveform databases are used in measurement test instruments, such as oscilloscopes, spectrum analyzers and the like, for accumulating digital data samples of an acquired signal under test, such as a digital communications signal. The waveform database is a two-dimensional array of counters where the rows represent magnitude values and the columns represent acquisition times. Acquisition circuitry in the measurement test instrument samples the magnitude of the incoming signal and generates digital data samples defining a waveform record. Each digital data sample includes a magnitude component representing a voltage level, power level or the like and a time component representing the relative time each digital data sample is acquired relative to other digital data samples. The waveform record length is a user defined parameter. The digital data samples of the waveform records are accumulated by the counters of the waveform database with the magnitude component of the sample defining a row location and the time component defining the column location. The accumulated counts of the digital data samples are transformed into intensity levels or color values based on the number count of each of the respective counters. A display device, such a cathode ray tube, liquid crystal display or the like displays the intensity levels or color values.

U.S. Pat. No. 5,343,405 to Kucera et al. describes various hardware systems for generating a waveform database used for automatic extraction of pulse parametric values from a digital serial communications signal forming an "eye" pattern. One described hardware device is a communications signal analyzer that samples the communications signal and generates waveform traces from acquired digital data samples. The digital data samples from each trace are accumulated in the waveform database. The digital data samples from the acquired waveform traces are continuously added to the waveform data database until a "STOP COMMAND" is issued. A "CLEAR COMMAND" is used to empty the contents of the waveform database and start accumulating a new set of waveform traces. Histogram and statistical analysis of the contents of the waveform database can be continuously performed as the waveform traces are accumulated into the waveform database. The contents of the waveform database is transformed to pixel coordinates of a display device, such as a cathode ray tube, liquid crystal display or the like and displayed as varying intensity levels or different colors based on the count levels of magnitude and time coordinates in the waveform database.

U.S. Pat. No. 6,151,010 to Miller et al. describes a digital oscilloscope having a variable persistence display. The oscilloscope acquisition circuitry samples the incoming signal in response to the arming of a trigger circuit and stores digital data samples of the signal in a segmented memory. A trigger signal terminates the writing of digital data samples into the segmented memory and freezes the contents of the memory. A large number of acquisitions may be stored simultaneously before any of the data is read out to an accumulation persistence map generator. The accumulated data in the segmented acquisition memory is provided to the accumulation persistence map generator that scales and time aligns the acquisition records. The scaled and time aligned samples from the acquisition records are accumulated in a three-dimensional persistence map where two dimensions of the map correspond to amplitude and time and the third dimension is population. Once the accumulated data from the segmented memory is accumulated in the three dimension persistence map, the next acquisition of digital data samples of the incoming signal is stored in the segmented memory and frozen. A persistence map decay ages the population statistics held in the three-dimensional persistence map. In response to a user selected decay time, the persistence map decay proportionally ages each of the populations at the amplitude and time locations to provide an exponential decay. Periodically, a percentage of the populations of each voltage and time location are decimated based on the user selected decay time. This proportional aging maintains the statistical integrity of the three-dimensional persistence map. The amplitude-time-population statistics in the three-dimensional persistence map are converted into pixel information for the oscilloscope display. The population statistics are assigned to 32 different shades of a waveform trace color defined for the input channel of the oscilloscope.

A drawback to existing waveform databases and persistence maps arises from the continuous accumulation of the underlying data in the waveform databases and persistence maps. Any changes in the signal input, such as signal drift, signal noise and the like, will be accumulated in the waveform database or persistence map. For example, a user may wish to observe changes in the output of a telecommunications circuit as the bias on a laser is varied. Changing the bias on the laser will change the extinction ratio of the signal that is displayed as an eye pattern on the oscilloscope. The changes in the signal input caused by the tuning of the laser will be accumulated in the waveform database and the persistence map irrespective of the population aging of the persistence map. As stated in the '010 patent, the proportional aging the persistence map maintains the statistical integrity of the map. The result is a closing of the eye pattern of the input signal as changes in the laser bias varies the output signal of the communications circuit. Any histogram or statistical measurement on the accumulated data in the waveform database or the persistence map will be flawed by the continuous accumulation of the underlying signal data. As a result, users need to continuously clear the waveform database or persistence map and acquire new signal data while adjusting the laser to observe the changes produced by the adjustment and statistically measure the results of the changes.

What is needed is a method of acquiring signal data of a repetitive signal, such as a telecommunications signal, and generating a time aged waveform database as compared to continuously accumulating waveform data and performing population aging of the persistence map. The time aged waveform database should provide variable persistence that continuously tracks changes of the input signal and continuously changing histogram and statistical data on the current state of the accumulating waveform database.

SUMMARY OF THE INVENTION

Accordingly, the present invention is a method of generating a variable persistence waveform database wherein a First-In-First-Out time-ordered queue buffer is defined for maintaining a selected number of waveform records. Digital data samples of a measurement signal are acquired in a plurality of waveform records. Each acquired waveform record is stored in the First-In-First-Out time-ordered queue buffer. Counts of the digital data samples for the plurality of waveform records are accumulated in a waveform database. Upon filling the First-In-First-Out time-ordered queue buffer with waveform records, the digital data samples of the oldest acquired waveform record are subtracted from the accumulated counts of the waveform database and the waveform record is deleted from the First-In-First-Out time-ordered queue buffer. The newest acquired waveform record is stored to the First-In-First-Out time-ordered queue buffer and the counts of the digital data samples of the newest acquired waveform record are added into the waveform database.

The number of waveform records stored in the First-In-First-Out time-ordered queue buffer is preferably variable from 1 to 2000 with the number of waveform records stored in the queue buffer varying the persistence of the waveform database. Statistical and histogram measurements may be continuously generated from the continuously changing waveform records stored in the First-In-First-Out time-ordered queue buffer.

In the preferred embodiment of the invention, each digital data sample has a magnitude component and a time component and the waveform database corresponds to horizontal and vertical pixel coordinates of a display device, and the accumulating step includes transforming the magnitude components of the digital data samples to the vertical pixel coordinates of the display device and transforming the time components of the digital data samples to the horizontal pixel coordinates of the display device prior to accumulating the counts of the digital data samples. Alternately, the accumulating step may include transforming the magnitude components of the digital data samples to the vertical pixel coordinates of the display device prior to storing the waveform records in the First-In-First-Out time-ordered queue buffer. Statistical and histogram measurement are preferably generated from the continuously changing accumulated counts of the digital data samples in the waveform database. The accumulated counts of the waveform database are displayable on a display device along with statistical and histogram measurements. The digital data samples of the waveform records may be compressed to match the horizontal pixel coordinates of the display device when the resolution of the waveform record exceeds that of the pixel coordinates. The digital data samples of the waveform records may be equally distributed over the horizontal pixel coordinates when the digital data samples of the waveform record are less than the pixel coordinates of the display device.

The objects, advantages and novel features of the present invention are apparent from the following detailed description when read in conjunction with appended claims and attached drawings.

DETAILED DESCRIPTION OF THE PREFERRED EMBODIMENT

In the following detailed description numerous specific details are set forth in order to provide a thorough understanding of the present invention. However, it will be understood by those skilled in the art that the present invention may be practiced without these specific details. In other instances well known methods, procedures, components, and circuits have not been described in detail so as not to obscure the present invention.

Part of the description will be presented in terms of operations performed by a digitizing instrument, using terms such as data, values, signal samples, numbers and the like, consistent with the manner commonly employed by those skilled in the art to convey the substance of their work to others skilled in the art. As is well understood by those skilled in the art, these quantities take the form of electrical, magnetic, or optical signals capable of being stored, transferred, combined and otherwise manipulated through mechanical and electrical components of the digitizing instrument; and the term digitizing instrument includes general purpose as well as special purpose data processing machines, systems, and the like, that are stand alone, adjunct or embedded.

Various operations will be described as multiple discrete steps in a manner that is most helpful in understanding the present invention. The order of description should not be construed as to imply that these operations are necessarily order dependent, in particular, the order of their presentation.

Figure 1:
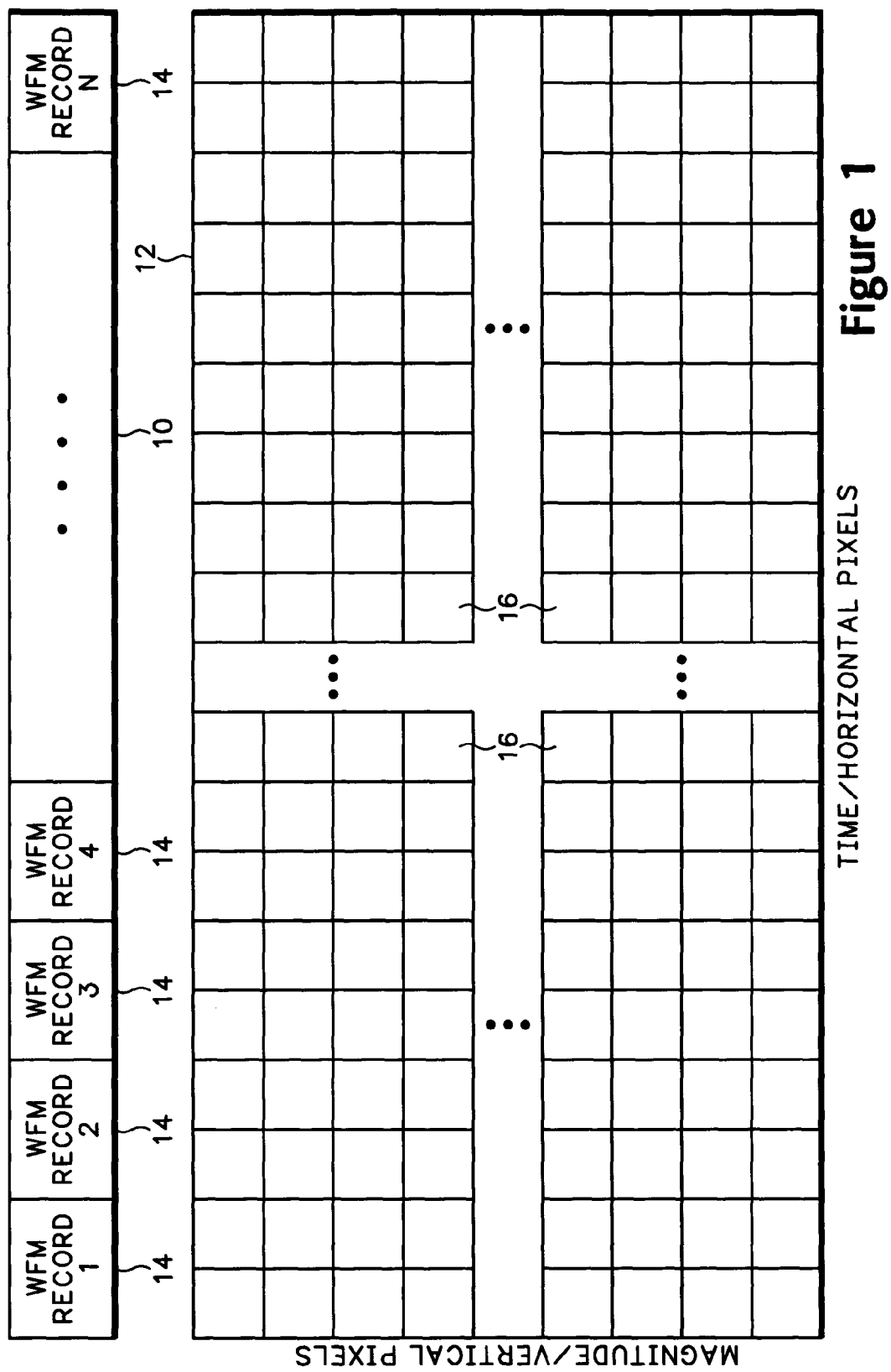
FIG. 1 representatively illustrates a FIFO time-ordered queue buffer 10 and a variable persistence waveform database 12 in the method of generating a variable persistence waveform database according to the present invention.

The method of generating a variable persistence waveform database of the present invention varies a waveform database based on waveform record aging using acquired digital data samples of the waveform records. A measurement test instrument, such as a oscilloscope, spectrum analyzer, or the like samples an incoming signal and generates digital data samples. The digital data samples are organized into waveform records having a defined record length (i.e. the number of digital data samples in the waveform record) and stored in a First-In-First-Out (FIFO) time-ordered queue buffer. The number of waveform records in the FIFO time-ordered queue buffer is specified by a user's input and defines the level of persistence for the variable persistence waveform database. FIG. 1 illustrates the FIFO time-ordered queue buffer 10 and the variable persistence waveform database 12. At the start of each new acquisition of a waveform record, a new buffer 14 is assigned from a pool of free buffers for each new waveform record. As each digital data sample of the waveform record is stored in the buffer, a count of the sample is also accumulated in the variable persistence waveform database 12. The variable persistence waveform database 12 is an addressed array of counters 16 whose addresses may be defined by the magnitude values of the digital data samples and relative time each sample is acquired. The variable persistence waveform database 12 is built-up by the continuously accumulating counts of the acquired digital data samples being stored as waveform records in the FIFO time-ordered queue buffer 10. When the number of waveform records in the FIFO time-ordered queue buffer 10 reaches the preset limit defined by the user, the digital data samples of the oldest waveform record are subtracted from the appropriate counters 16 in the variable persistence waveform database 12 and the waveform record buffer 14 is deleted from the FIFO time-ordered queue buffer 10. During the time the oldest waveform record is being subtracted and deleted, the digital data samples for the newest waveform record are being acquired, added to the appropriate counters 16 in the variable persistence waveform database and stored in the FIFO time-order queue buffer 10. The subtraction of the oldest waveform records from the variable persistence waveform database 12 and the deletion of the waveform record from the FIFO time-ordered queue buffer 10 and the addition of the newest waveform record to the variable persistence waveform database 12 and to the FIFO time-ordered queue buffer 10 continues until parameter changes are made to the measurement test instrument or the waveform acquisitions are stopped. The variable persistence waveform database of the present invention functions by waveform record aging of the database based on the size of the FIFO time-ordered queue buffer whereas the prior art persistence map functions by population aging the map based on a defined constant percentage decay. The variable persistence waveform database of the present invention generates an exact representation of the currently stored digital data samples in the FIFO time-ordered queue buffer whereas the persistence map of the prior art maintains the statistical integrity of the persistence map. The variable persistence waveform database of the present invention more accurately depicts the current state of the a device under test whereas the prior art persistence map retains older states of the device under test to maintain statistical integrity of the map. The variable persistence waveform database of the present invention will be described in relation to digital data samples having magnitude components and time components. However, the data stored in the FIFO time-ordered queue buffer 10 is not limited to magnitude and time components and other data components, such as frequency, power, voltage may by stored in the waveform records of the buffer.

Figure 2:
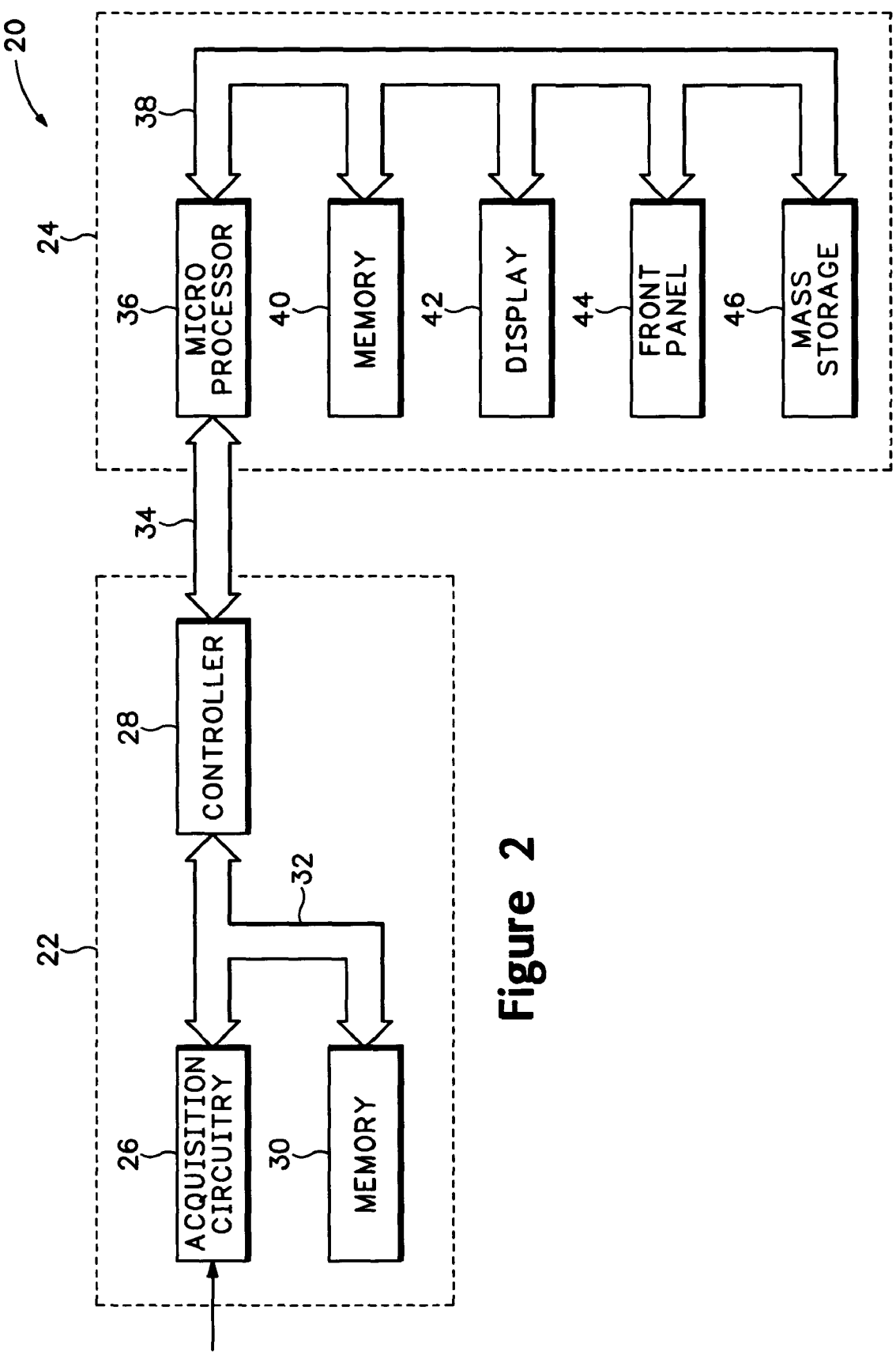
FIG. 2 is a representative block diagram of a measurement test instrument for generating a variable persistence waveform database according to the present invention.

Referring to FIG. 2, there is shown a representative block diagram of a measurement test instrument 20, such as an oscilloscope, spectrum analyzer or the like, for acquiring digital data samples of an input signal. The measurement test instrument 20 includes an acquisition subsystem 22 and an instrument control and display subsystem 24. The acquisition subsystem 22 includes acquisition circuitry 26 coupled to an input channel of the measurement test instrument for receiving the input signal and generating digital data samples of the input signal. The acquisition circuitry 26 operates under control of a controller 28 that provides commands and values to the acquisition circuitry 26 for acquiring, storing and generating the variable persistence waveform database of the present invention. The acquired digital data samples are stored as a series of waveform records in the First-In-First-Out (FIFO) time-ordered queue buffer 10 in memory 30 that is coupled to the acquisition circuitry 26 and controller 28 via a data and address bus 32. The digital data samples in the waveform records are contemporaneously stored in a variable persistence waveform database also in memory 30. The accumulated data in the variable persistence waveform database is coupled to the instrument control and display subsystem 24 via a PCI backplane 34. The instrument control and display subsystem 24 includes a microprocessor 36, such as PENTIUM® or Celeron™ microprocessor, manufactured and sold by Intel, Corp., Santa Clara, Calif., or similar types of microprocessors. A subsystem bus 38 couples the microprocessor 36 to memory 40, a display device 42, such a liquid crystal display, cathode ray tube or the like, and front panel controls 44 with buttons, rotatable knobs and the like and/or control entry devices, such as a keyboard and/or mouse. A mass storage unit or units 46, such as a hard disk drive, a CD ROM drive, a tape drive, a floppy drive or the like, that reads from and/or writes to appropriate mass storage media, may also be connected to the subsystem bus 38. Program instructions that control the functions of the measurement test instrument 20 may be stored and accessed from the memory 40 or from the mass storage media of the mass storage unit 46. The control and display subsystem 24 in the preferred embodiment of the invention is a PC based system controlled under WINDOWS® 98 operating system, manufactured and sold by Microsoft, Corp., Redmond, Wash.

The acquisition circuitry 26 may be that of an equivalent time oscilloscope, such as described in U.S. Pat. No. 6,384,657, titled "PHASE STARTABLE CLOCK DEVICE HAVING IMPROVED STABILITY" (Dobos), herein incorporated by reference. The acquisition circuitry 26 is responsive to user input from the front panel 44 or display icons and boxes on display 42 that are used to set the record length of the acquired waveform records, the time-per-division setting of the instrument 20 and the like. The combination of the record length and time-per-division setting establishes the sampling spacing of the digital data samples. In the preferred embodiment, the record length may vary from 50 to 4000 digital data samples. The acquisition circuitry 26 includes a sampler that receives a strobe signal from a strobe generator for acquiring samples of the input signal at selected time increments defined by the instrument settings. The strobe generator receives and stores course and fine time delay values from the controller 28. A clock signal is provided to the strobe generator from a phase startable clock device that is initiated in response to a trigger signal provided to the phase startable clock device. The clock signal decrements a counter in the strobe generator that is loaded with the coarse time delay value. When the counter reaches the terminal count, a coarse strobe is generated. The course strobe is coupled to a fine time delay vernier circuit that generates a ramp signal equal to the time interval between the course clock signal. The fine time delay value from the controller 28 is converted to an analog voltage and compared with the ramp signal. When the ramp signal equals the fine time delay value, a sample strobe is generated by the strobe generator. The strobe generator outputs successively delayed strobe pulses for each occurrence of the trigger signal. The samples of the input signal are coupled to an analog-to-digital converter that converts the magnitudes of the signal samples to equivalent digital data samples. The digital data samples are stored as a waveform record in the First-In-First-Out (FIFO) time-ordered queue buffer 10 in memory 30 having a record length and samples spacing defined by the front panel input. Thus, each digital data sample has a magnitude component based on the sampled input signal and an inherent time component based on the defined sample spacing. Upon acquiring the required number of digital data samples for one waveform record, the controller 28 resets the acquisition circuitry 26 and the next waveform record is acquired.

The digital data samples of the waveform records are contemporaneously stored in the variable persistence waveform database 12 in memory 30. In the preferred embodiment of the invention, the variable persistence waveform database 12 corresponds to pixel locations on the display device 32 having a 400 by 500 pixel array waveform display area. The digital data samples from each waveform record stored in the FIFO time-ordered queue buffer 12 are mapped into the variable persistence waveform database 12 using well known mapping algorithms. For example, if the waveform record length is less than 500, the mapping algorithm equally spaces the digital data samples horizontally within the waveform database 12. If the waveform record is greater than 500, the mapping algorithm horizontally compresses the digital data samples by combining adjacent digital data. In the preferred embodiment of the invention, the magnitude values of the digital data samples, which have a digital resolution of 14 bits, are compressed into 9 bit values for storage in the variable persistence waveform database 12. In the preferred embodiment of the invention, the magnitude values of the digital data samples are compressed into the 9 bit values prior to storing the values in the FIFO time order queue buffer 10. Alternatively, the magnitude of the digital data samples may be stored in the FIFO time-ordered queue buffer in uncompressed form and compressed into the 9 bit values as they are mapped into the variable persistence waveform database 12. As previously described, the variable persistence waveform database 12 may contain all of the digital data samples of the waveform records and the uncompressed magnitude values of the digital data samples. In such an embodiment, the uncompressed variable persistence waveform database is compressed and mapped into a display memory having a pixel array corresponding to the display device 32.

In the preferred embodiment of the invention, the controller 28 is implemented as multiple controllers. A digital signal processor (DSP) controller, such as DSP56303, manufactured and sold by Motorola, Inc., controls the operation of the acquisition circuitry 26 for acquiring the digital data samples. A Power PC controller, such as manufactured and sold by Motorola Inc. under Part Number MPC740, controls the generation of the FIFO time-ordered queue buffer 10 and the variable persistence waveform database 12. Memory 30 is preferably two separate memories with one memory for storing the digital data samples in the FIFO time-ordered queue buffer 10 and the other memory for accumulating the digital data values in the variable persistence waveform database 12.

Figure 3:
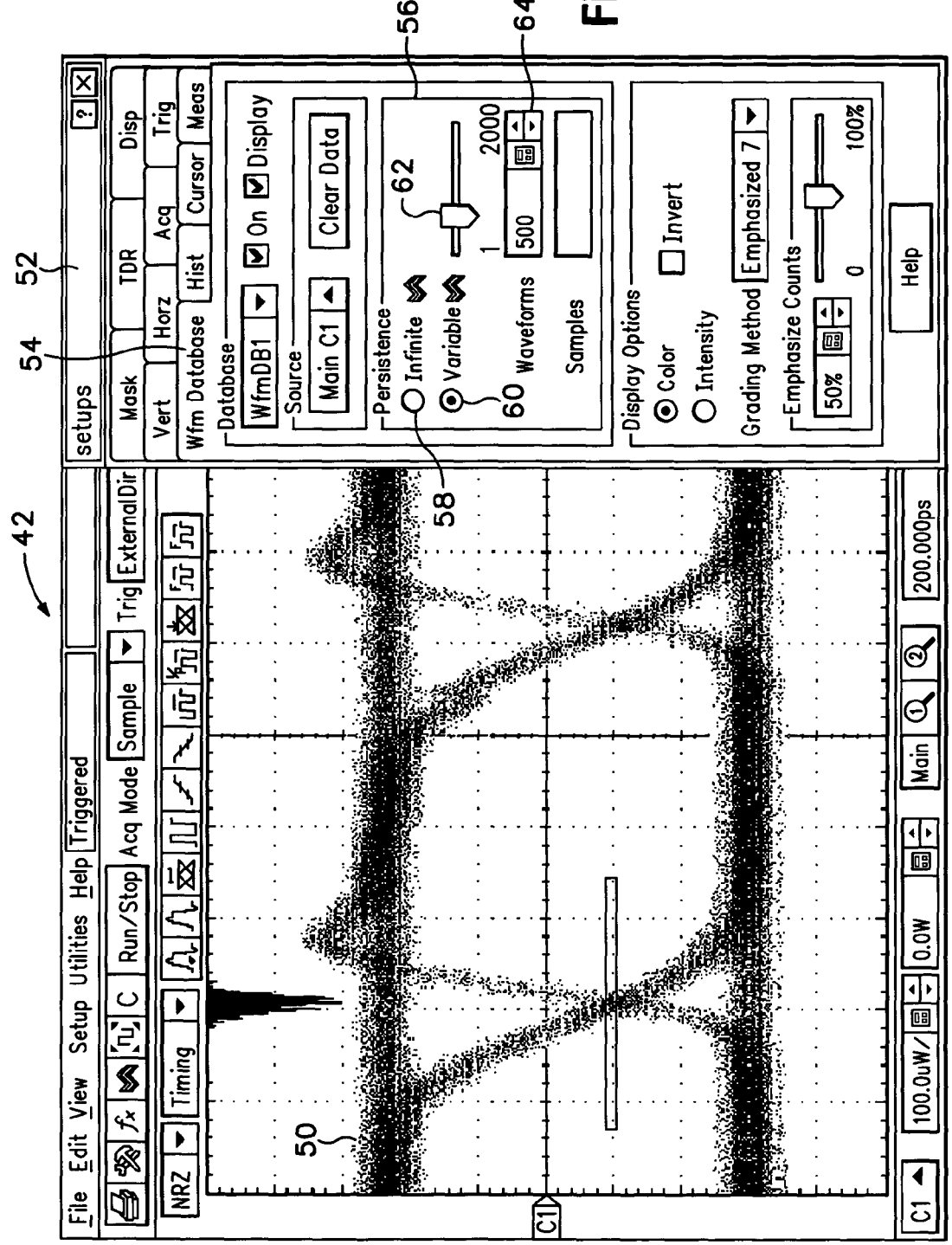
FIG. 3 illustrates a representative variable persistence waveform display on the display device generated from the variable persistence waveform database according to the present invention.

The accumulated digital data samples of the variable persistence waveform database 12 are read out of memory 30 on a continuing basis and coupled via the PCI backplane 34 to the instrument control and display subsystem 24. Software algorithms in the instrument control and display subsystem 24, such as intensity or color variation mappers, display drivers and the like, process the variable persistence waveform database data and display the results on the display device 42. The accumulation counters in the variable persistence waveform database 12, which may vary from 16 to 32 bits, are compressed into 4 bit values representing intensity levels or color variations on the display device 42. Referring to FIG. 3, there is shown a representative variable persistence waveform display on the display device 42 generated from the variable persistence waveform database 12. The displayed waveform 50 represents a bi-state communications signal that produces an "eye" pattern. Overlying a portion of the waveform 50 is a SETUPS window 52 that is activated by a mouse click on a SETUPS icon on the display. The SETUPS window 52 includes a number of tabs that allows a user to set instrument and measurement parameters. One such tab labeled WFM DATABASE 54 allows the user to set the persistence level of the variable persistence database 12. The WFM DATABASE tab 54 includes a PERSISTENCE region 56 having INFINITE and VARIABLE designators 58 and 60. Associated with the VARIABLE designator 60 is a slide icon 62 and a WAVEFORMS box 64. A user selects the type of waveform display by clicking on one of the INFINITE or VARIABLE designators 58 and 60. If INFINITE persistence is selected, the FIFO time-ordered queue buffer 10 is inactivated and waveform records are added to the waveform database without any of the waveform records being deleted. If the VARIABLE persistence is selected, the user may vary the number of waveform records in the FIFO time-ordered queue buffer 10 from 1 to 2000 by moving the slide icon 62 or clicking on the up and down arrows in the WAVEFORMS box 64. The number of waveforms displayed in the WAVEFORM box 64 varies as the slide icon 62 is moved. The microprocessor 36 monitors the number of waveforms records selected by the user and passes the waveform parameter data to the controller 28 via the PCI bus 34. The controller 28 configures the FIFO time-ordered queue buffer 10 to store the selected number of waveforms. The controller 28 clears the FIFO time-ordered queue buffer 10 and the variable persistence waveform database and starts the acquisition of digital data samples. The digital data samples are stored in the FIFO time-order queue buffer as time-ordered waveform records and accumulated as counts in the variable persistence waveform database. When the number of waveform records in the FIFO time-ordered queue buffer 10 reaches the user selected limit, the digital data samples of the first acquired waveform record is subtracted from the appropriate counter 16 in the variable persistence waveform database 12 and deleted from the buffer 10. The digital data samples of the next acquired waveform record is added to the appropriate counters 16 in the variable persistence waveform database 12 and to the FIFO time-ordered queue buffer 10. For example, the user selects 500 waveform records for the display of the variable persistence waveform database 12. The acquisition subsystem initially acquires digital data samples to generate 500 waveform records. The 500 waveform records are time-ordered and stored in the FIFO time-ordered queue buffer 10 and accumulated in the variable persistence database. As the acquisition subsystem acquires the $501^{st}$ waveform record, the $1^{st}$ waveform record is subtracted from the variable persistence waveform database 12 and deleted from the FIFO time-ordered queue buffer 10. As the $502^{nd}$ waveform record is acquired, the $2^{nd}$ waveform record is subtracted from the variable persistence waveform database and deleted from the FIFO time-ordered queue buffer. Therefore, the variable persistence waveform database contains accumulated data from the latest 500 waveform records at any one time. Increasing the number of waveform records accumulated in the variable persistence waveform database 12 by increasing the number of waveform records in the FIFO time-order queue buffer 10 increases the persistence of the resulting display whereas decreasing the number of waveform records accumulated in the variable persistence waveform database 12 by decreasing the number of waveform records in the FIFO time-ordered queue buffer 10 decreases the persistence of the resulting display.

Figure 4:
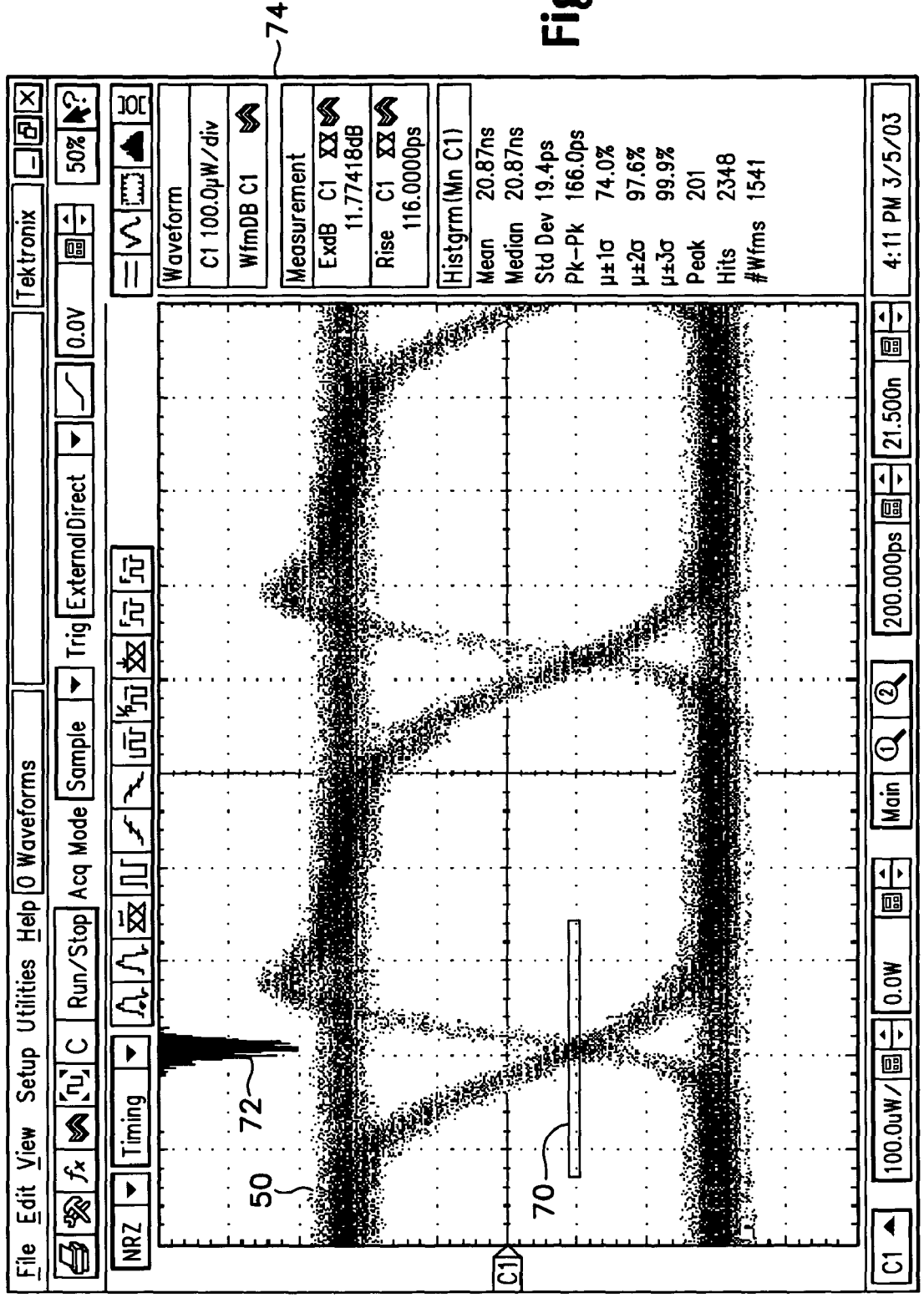
FIG. 4 illustrates a histogram and statistical data displayed on the display device with the variable persistence waveform display generated from the variable persistence waveform database according to the present invention.

Referring to FIG. 4, there is shown another view of the variable persistence waveform display on the display device 42. The displayed waveform 50 again represents a bi-state communications signal that produces an "eye" pattern. A relatively thin horizontal histogram box 70 is positioned on the displayed waveform at the crossing time where the communications signal is transitioning from a low level to a high level or a high level to a low level. The accumulated digital data samples of the variable persistence database contained within the box 70 are processed to produce a histogram display 72 and statistical data 74, such as mean, medium standard deviation and the like, which is displayed adjacent to the displayed waveform 50. The accumulated sample counts of the variable persistence waveform display 12 within the box 70 are summed column by column to produce the histogram display 72 and provide the numerical basis for the statistical analysis. The displayed waveform 50, the histogram display 72 and the statistical data 74 vary as a function digital data samples of the waveform records being subtracted and added to the variable persistence waveform database 12. The variable persistence waveform database has been described in relation to measurement test instrument where the input signal and the sampling strobe pulses are held in a synchronized relationship in time. The digital data samples are acquired at a uniform sample spacing which provides inherent timing information for each sample. Alternately, the digital data samples may be acquired in a random manner, such as in a random sampling oscilloscope. The random sampling oscilloscope samples the input signal magnitude at random points in time with respect to the input signal. The random sampling technique determines the input signal magnitude by sampling the input signal using well known sampling devices. However, the time position of a given magnitude sample is determined by measuring the elapsed time occurring between the start of a given cycle of the input signal and the random collision between the signal and the sample strobe pulses. This requires the FIFO time-ordered queue buffer to store the magnitude of the digital data sample and the time at which the sample is acquired. Since the digital data samples are randomly acquired in time, some samples may collide with previously acquired samples and some portion of the waveform record may not contain samples. Further, the timing spacing between the samples will not be uniform. The controller 28 preferably orders the digital data samples in the proper time order prior to storing the samples in the FIFO time-ordered queue buffer 10. The variable persistence waveform database is configured with a desired sample interval and magnitude levels. The sample intervals represents time bins which count the occurrences of the digital data samples from the FIFO time-ordered queue buffer that fall within the time bin range. The magnitude levels represent rows in the pixel array of the display device 42. The controller 28 compresses the magnitude and time data in the FIFO time-ordered queue buffer 10 to the variable persistence waveform database 12. Counts of the digital data samples of the waveform records are accumulated in the counters of the respective time bins. Various techniqueues may be used to combine the magnitude values of the digital data samples with the bin into a single magnitude value. As the variable persistence waveform database 12 is built-up from multiple waveform records, gaps in the waveform records are filled in by other waveform records. Varying the persistence of the waveform database and the display of the variable persistence waveform database 12 is the same as previously described.

A method has been described for generating a variable persistence waveform database where a First-In-First-Out time-ordered queue buffer stores digital data samples of an input signal in time-ordered waveform records. The digital data samples represent the magnitude of the input signal at the time the input signal is sampled. The number of time-ordered waveform records stored in the FIFO time-ordered queue buffer is a user defined variable which varies the persistence of the variable persistence waveform database. Counts of each of the digital data samples in each waveform record are accumulated in an array of counters in a variable persistence waveform database where each counter represents a magnitude level and a time location. Waveform records are added to the FIFO time-ordered queue buffer and the counts of the digital data samples in each waveform record are added to the variable persistence waveform database until the user defined number of waveform records are stored in the FIFO time-ordered queue buffer. Before the next waveform record is stored in the queue buffer, the digital data samples of the oldest waveform record are subtracted from the appropriate counters in the variable persistence waveform database and the waveform record is deleted from the queue buffer. Counts of the digital data samples of the new waveform record are added to the appropriate counters in the variable persistence waveform database and the waveform record is added to the queue buffer. Varying the number of waveform records in the FIFO time-ordered queue buffer varies the persistence of the data in the variable persistence waveform database.

It will be obvious to those having skill in the art that many changes may be made to the details of the above-described embodiments of this invention without departing from the underlying principles thereof. The scope of the present invention should, therefore, be determined only by the following claims.

What is claimed is:

1. A method of generating a variable persistence waveform database comprising the steps of:
    defining a First-In-First-Out time-ordered queue buffer for maintaining a selected number of waveform records;
    acquiring digital data samples of a measurement signal in a plurality of waveform records with each digital data sample having a magnitude value and time value;
    storing each acquired waveform record in the First-In-First-Out time-ordered queue buffer;
    accumulating counts of the digital data samples for the plurality of waveform records in the waveform database having an addressed array of counters with addresses
defined by the magnitude values of the digital data samples and relative time each sample is acquired;
    upon filling First-In-First-Out time-ordered queue buffer with waveform records, subtracting the digital data samples of the oldest acquired waveform record from the accumulated counts of the waveform database and deleting the waveform record from the First-In-First-Out time-ordered queue buffer and storing the newest acquired waveform record to the First-In-First-Out time-ordered queue buffer and adding the counts of the digital data samples of the latest acquired waveform record into the waveform database; and
    displaying the accumulated counts of the waveform database on a display device.

2. The method of generating a variable persistence waveform database as recited in claim 1 wherein the defining step further comprises the step of varying the persistence of the waveform database by varying the selected number of waveform records stored in the First-In-First-Out time-ordered queue buffer.

3. The method of generating a variable persistence waveform database as recited in claim 1 wherein each digital data samples has a magnitude component and a time component and the waveform database corresponds to horizontal and vertical pixel coordinates of a display device and the accumulating step further comprises the steps of transforming the magnitude components of the digital data samples to the vertical pixel coordinates of the display device and transforming the time components of the digital data samples to the horizontal pixel coordinates of the display device prior to accumulating the counts of the digital data samples.

4. The method of generating a variable persistence waveform database as recited in claim 1 further comprising the step of continuously generating statistical and histogram measurements from the continuously changing accumulated counts of the digital data samples in the waveform database.

5. The method of generating a variable persistence waveform database as recited in claim 4 further comprising the step of continuously displaying the statistical and histogram measurements from the continuously changing accumulated counts of the digital data samples in the waveform database on the display device.

6. The method of generating a variable persistence waveform database as recited in claim 1 wherein each digital data samples has a magnitude component and a time component and the waveform database corresponds to horizontal and vertical pixel coordinates of a display device and the accumulating step further comprises the step of transforming the magnitude components of the digital data samples to the vertical pixel coordinates of the display device prior to accumulating the counts of the digital data samples.

7. The method of generating a variable persistence waveform database as recited in claim 1 wherein each digital data samples has a magnitude component and a time component and the waveform database corresponds to pixel coordinates of a display device and the storing step further comprises the step of transforming the magnitude components of the digital data samples to the vertical pixel coordinates of the display device prior to storing the waveform records in the First-In-First-Out time-ordered queue buffer.

8. The method of generating a variable persistence waveform database as recited in claim 1 wherein each digital data samples has a magnitude component and a time component and the waveform database corresponds to pixel coordinates of a display device and the accumulating step further comprises the step of transforming the time components of the digital data samples to the horizontal pixel coordinates of the display device prior to accumulating the counts of the digital data samples.

9. The method of generating a variable persistence waveform database as recited in claim 8 wherein the acquired digital data samples in the waveform records exceed the pixel coordinates of the display device and the step of transforming the time components further comprises the step of compressing the digital data samples of the waveform record to match the horizontal pixel coordinates of the display device.

10. The method of generating a variable persistence waveform database as recited in claim 8 wherein the acquired digital data samples of the waveform records are less than the pixel coordinates of the display device and the step of transforming the time components further comprises the step of equally distributing the digital data samples of the waveform record over the horizontal pixel coordinates of the display device.

\* \* \* \* \*